United States Patent
Huang et al.

(10) Patent No.: US 7,582,947 B2
(45) Date of Patent: Sep. 1, 2009

(54) HIGH PERFORMANCE DEVICE DESIGN

(75) Inventors: Chien-Chao Huang, Hsin-Chu (TW); Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 472 days.

(21) Appl. No.: 11/243,959

(22) Filed: Oct. 5, 2005

(65) Prior Publication Data
US 2007/0075377 A1 Apr. 5, 2007

(51) Int. Cl.
H01L 29/00 (2006.01)
H01L 29/76 (2006.01)
H01L 29/94 (2006.01)
H01L 31/062 (2006.01)
H01L 31/113 (2006.01)

(52) U.S. Cl. .......... 257/510; 257/374; 257/387; 257/366

(58) Field of Classification Search ........... 257/374, 257/510, 288, 249, 368, 387, 365, 366, 331, 257/153
See application file for complete search history.

(56) References Cited

U.S. PATENT DOCUMENTS

| 6,218,688 B1 * | 4/2001 | Kalnitsky et al. ........... 257/280 |
| 6,309,929 B1 * | 10/2001 | Hsu et al. .................... 438/270 |
| 7,033,893 B1 * | 4/2006 | Xiang ........................ 438/275 |
| 7,052,964 B2 * | 5/2006 | Yeo et al. .................... 438/296 |
| 7,138,649 B2 * | 11/2006 | Currie et al. .................. 257/19 |

OTHER PUBLICATIONS

Liu, C.T., et al., "Severe Thickness Variation of Sub-3nm Gate Oxide Due to Si Surface Faceting, Poly-Si Intrusion, and Corner Stress," 1999 Symposium of VLSI Technology, Aug. 1999, 2 pages.

* cited by examiner

Primary Examiner—Chuong A. Luu
(74) Attorney, Agent, or Firm—Slater & Matsil, L.L.P.

(57) ABSTRACT

A semiconductor structure having a recessed active region and a method for forming the same are provided. The semiconductor structure comprises a first and a second isolation structure having an active region therebetween. The first and second isolation structures have sidewalls with a tilt angle of substantially less than 90 degrees. The active region is recessed. By recessing the active region, the channel width is increased and device drive current is improved.

18 Claims, 8 Drawing Sheets

HIGH PERFORMANCE DEVICE DESIGN

TECHNICAL FIELD

This invention relates generally to semiconductor devices, and particularly to manufacturing processes of semiconductor devices, and more particularly to the formation of shallow trench isolations and active regions.

BACKGROUND

Shallow trench isolation (STI) has been the most widely used isolation structure for sub 0.25 μm CMOS generation and beyond due to its good scalability and isolation performance. The main process steps of STI, i.e., dry etching silicon for trench formation and oxide gap-filling the trench, significantly impact device performance and reliability. As transistors are continuously scaled down, the electrical behavior of narrow width transistors is influenced more significantly by STI corner profiles and manufacturing processes than that of wide width transistors.

Among promising structures that have improved device performance and reliability, vertical structures, such as Fin-FETs, have excellent short channel control and increased drain current, thus are widely used. One of the reasons that FinFETs (or tri-gate transistors) have high drain currents is that their channels are formed along sidewalls of a vertical structure (such as the silicon "fin" of a FinFET). This significantly increases the effective channel width.

Vertical structures, however, suffer drawbacks. Compared to planar devices, source/drain extension resistances of Fin-FETs are high due to greater LDD implant angles. The high resistance is an inherent limitation for further improving Fin-FET transistor performance. Additonally, formation processes are complex due to difficulties caused by a high aspect ratio in manufacturing steps such as etching, implanting, and lithography, etc.

Therefore, what is needed is an improved planar MOS device that can overcome some of the shortcomings of vertical devices.

SUMMARY OF THE INVENTION

In accordance with one aspect of the present invention, a method of forming a MOS device having increased channel width includes forming a first and a second isolation structure in a semiconductor substrate and recessing the active region defined between the first and second isolation structures. The sidewalls of the first and second isolation structures have a tilt angle of substantially less than 90 degrees. An optional surface recovery process is preferably performed after the active region is recessed. The surface recovery process preferably includes an annealing and/or an oxidation and a wet etching. The method further includes forming a gate dielectric in the active region after the step of recessing the active region, forming a gate electrode over the gate dielectric, and forming a source/drain region substantially aligned with a sidewall of the gate electrode.

In accordance with another aspect of the present invention, a semiconductor structure having increased channel width includes a semiconductor substrate, a first and a second isolation structure in the semiconductor substrate having a first active region therebetween, wherein the sidewalls of the first and second isolation structures have a tilt angle of substantially less than about 90 degrees. The first active region is recessed. Due to recessing and an optional surface recovery process, the first active region preferably has a top surface with a curvature. A MOS device is formed in the active region with the channel width between the first and second isolation structures.

In accordance with yet another aspect of the present invention, the semiconductor structure further includes a third and a fourth isolation structure in the semiconductor substrate having a second active region therebetween, wherein the second active region is higher than the first active region. The semiconductor structure may further include a second MOS device formed in the second active region. The first active region is preferably a core device region, and the second active region is preferably a peripheral device region, such as an I/O device region.

By forming a recess in the active region, the channel width is increased and device drive current is improved without the cost of increased layout area.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
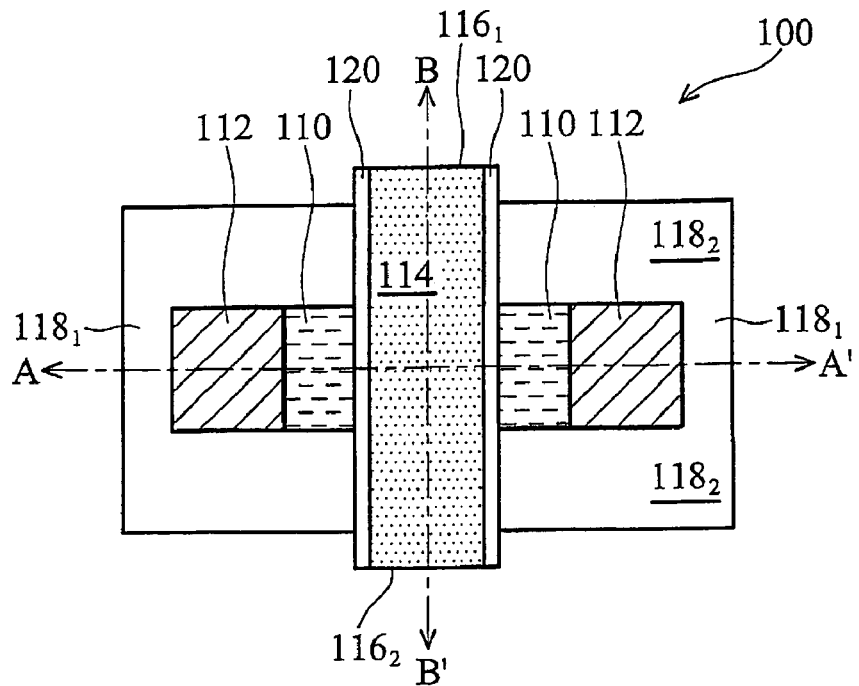
FIGS. 1A and 1B illustrate layouts of conventional MOS devices.
Figure 1B:
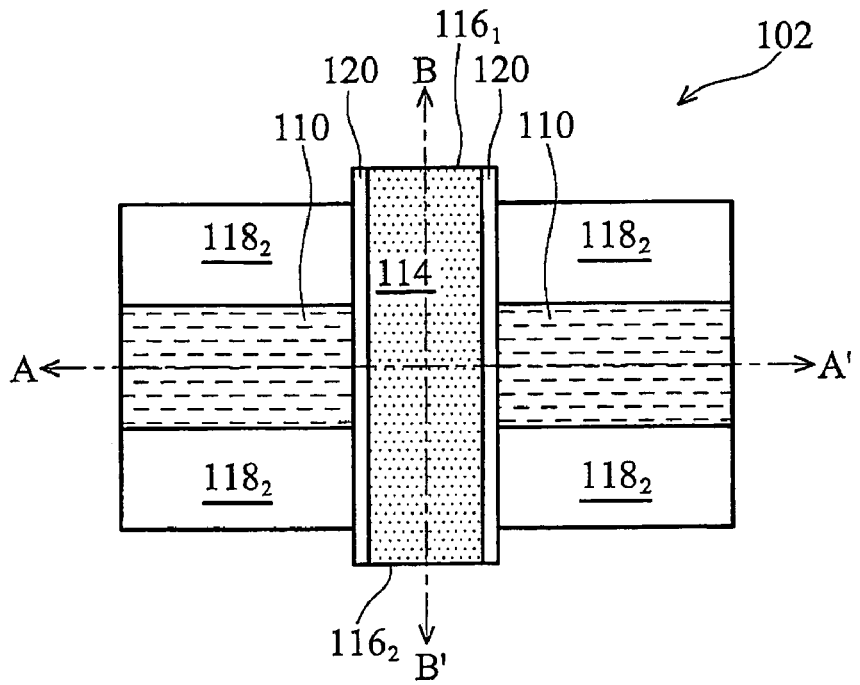

A novel method of forming a MOS device is provided. Throughout the various views and illustrative embodiments of the present invention, like reference numbers are used to designate like elements. FIGS. 1A and 1B illustrate schematic layouts of MOS devices 100 and 102, respectively. MOS devices 100 and 102 have similar structures except their source/drains are connected to other components of the integrated circuit in different ways. Each of the transistors 100 and 102 includes source/drain regions (active areas) 110, a gate electrode 114, and gate spacers 120. Gate electrode 114 is typically connected to other portions of the integrated circuit through a first end $116_1$ and/or a second end $116_2$. FIG. 1A illustrates the source/drain regions 110 connected to other components of the integrated circuit through contacts 112. In FIG. 1B, no contacts are formed, and the source/drain regions 110 and other source/drain regions of other devices (not shown) are interconnected directly. To reduce leakage current, the MOS devices 100 and 102 are typically isolated by shallow trench isolations (STI) 118, which include STI portions $118_1$ that isolate a respective MOS device along A-A' direction, or channel length direction, and STI portions $118_2$ that isolate a respective MOS device along B-B' direction, or channel width direction.

Figure 2A:
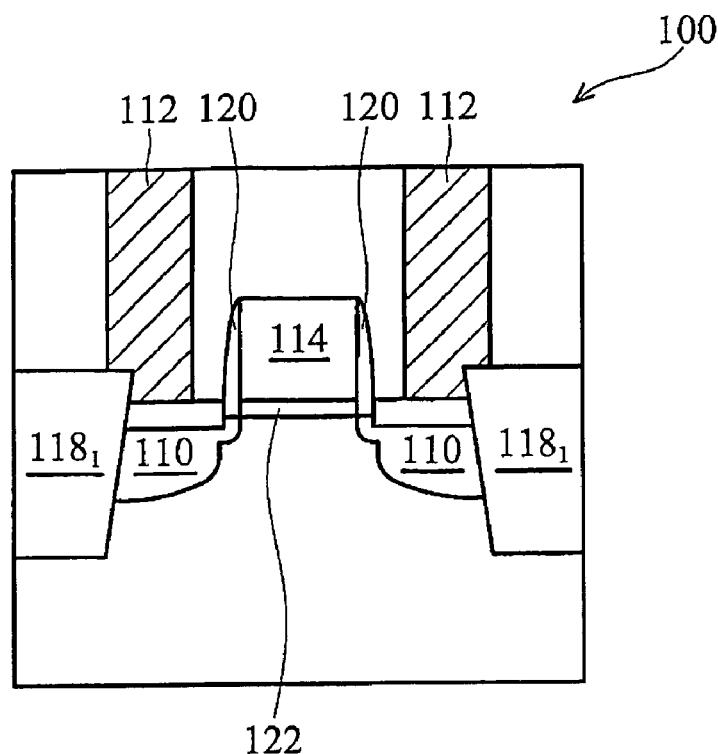
FIG. 2A illustrates a cross-sectional view of a MOS device along channel length direction A-A' of FIG. 1A.
Figure 2B:
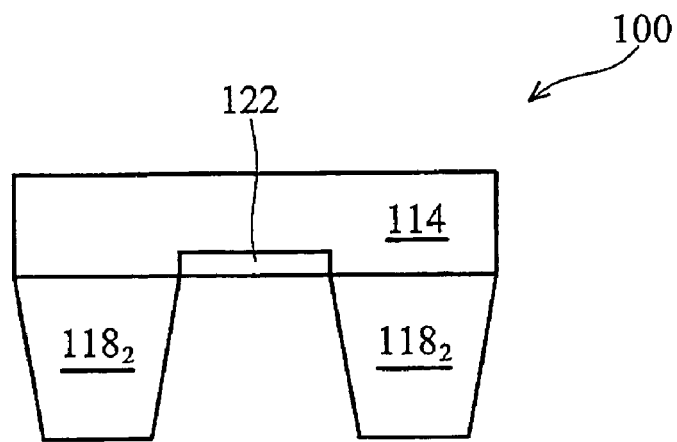
FIG. 2B illustrates a cross-sectional view of a MOS device along channel width direction B-B' of FIG. 1A.

FIG. 2A illustrates a cross-sectional view of the MOS device 100 along channel length direction A-A'. FIG. 2B illustrates a cross-sectional view of the MOS device 100 along channel width direction B-B'. Feature 122 is a gate dielectric.

Figure 3A:
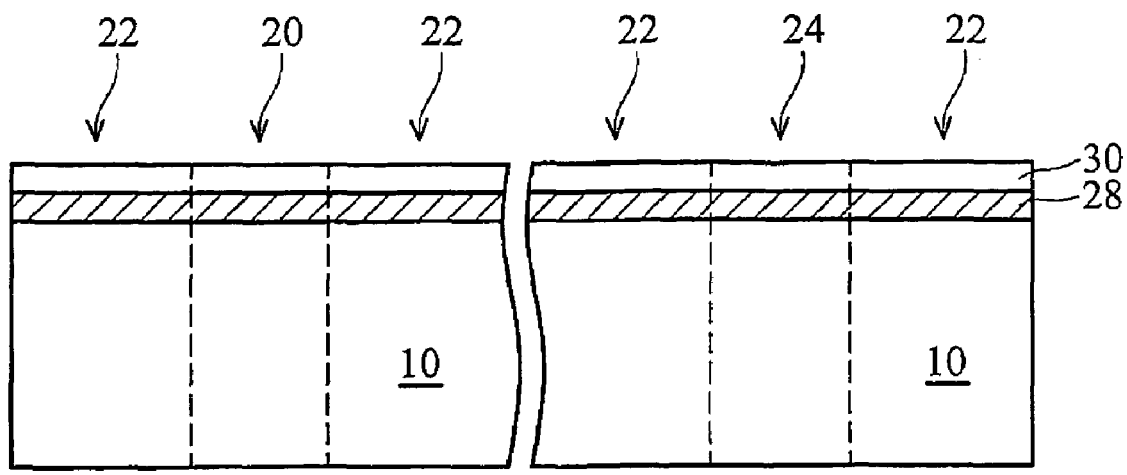
FIGS. 3A through 8B illustrate cross-sectional views of intermediate stages in the manufacture of a preferred embodiment of the present invention.

The intermediate stages of manufacturing a preferred embodiment of the present invention are illustrated in FIGS. 3A through 8B. If not specified, the cross-sectional views of the preferred embodiments are along channel width direction. FIGS. 3A and 3B illustrate cross sectional views of portions of a chip. In the preferred embodiment, a semiconductor chip includes a first active region 20 and a second active region 24. Preferably, active region 20 is a core device region, and the active region 24 is a peripheral device region, such as an I/O device region. Regions 22 are isolation regions comprising isolation structures, which are used to isolate different regions and/or devices, and are formed of dielectric materials.

In the preferred embodiment shown in FIG. 3A, semiconductor substrate 10 comprises commonly used materials, such as silicon, carbon, germanium, gallium, arsenic, nitrogen, aluminum, indium, and/or phosphorus, and the like, and combinations thereof. Substrate 10 may be in the form of single crystal or compound material. In order to improve the performance of the device, substrate 10 is preferably strained. However, non-strained materials can also be used.

Figure 3B:
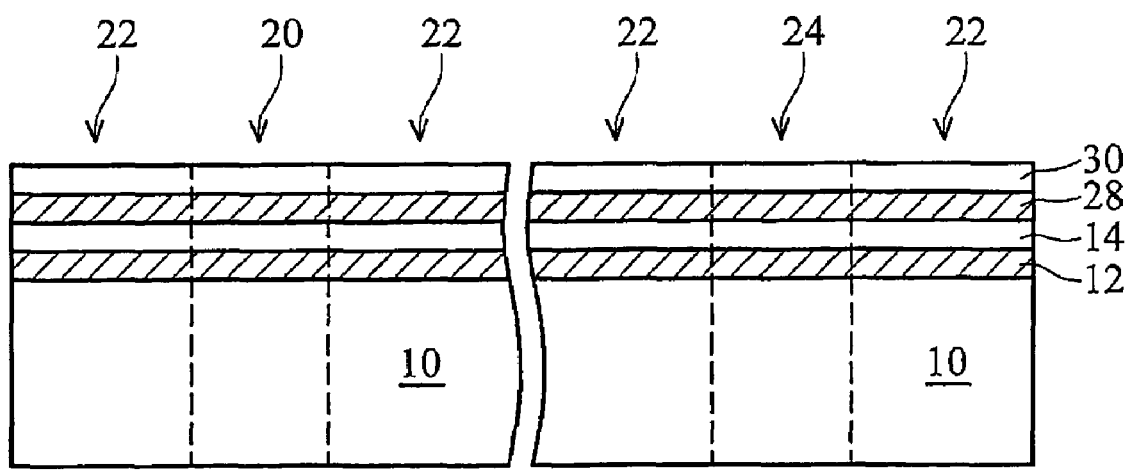

FIG. 3B illustrates another embodiment having a silicon-on-insulator (SOI) structure. The SOI structure includes a thin buried insulating layer, or preferably buried oxide (BOX) 12 over a first substrate 10, and a second substrate 14 over the BOX 12. Box 12 is preferably a thermal oxide. The second substrate 14 is preferably doped silicon, although other materials, such as Ge, SiGe, SiGeC and their combinations can be used. The first substrate 10 and the second substrate 14 may include the same material or different materials.

An optional pad layer 28 and a mask layer 30 are formed over the top most substrate (substrate 10 in FIG. 3A, or substrate 14 in FIG. 3B). Pad layer 28 is preferably a thin film formed through a thermal process. It is used to buffer substrate 10 and mask layer 30 so that less stress is generated. Pad layer 28 may also act as an etch stop layer for etching the subsequently formed mask layer 30. In the preferred embodiment, mask layer 30 is preferably formed of silicon nitride using low-pressure chemical vapor deposition (LPCVD). In other embodiments, mask layer 30 is formed by thermal nitridation of silicon, plasma enhanced chemical vapor deposition (PECVD) or plasma anodic nitridation using nitrogen-hydrogen.

Figure 4:
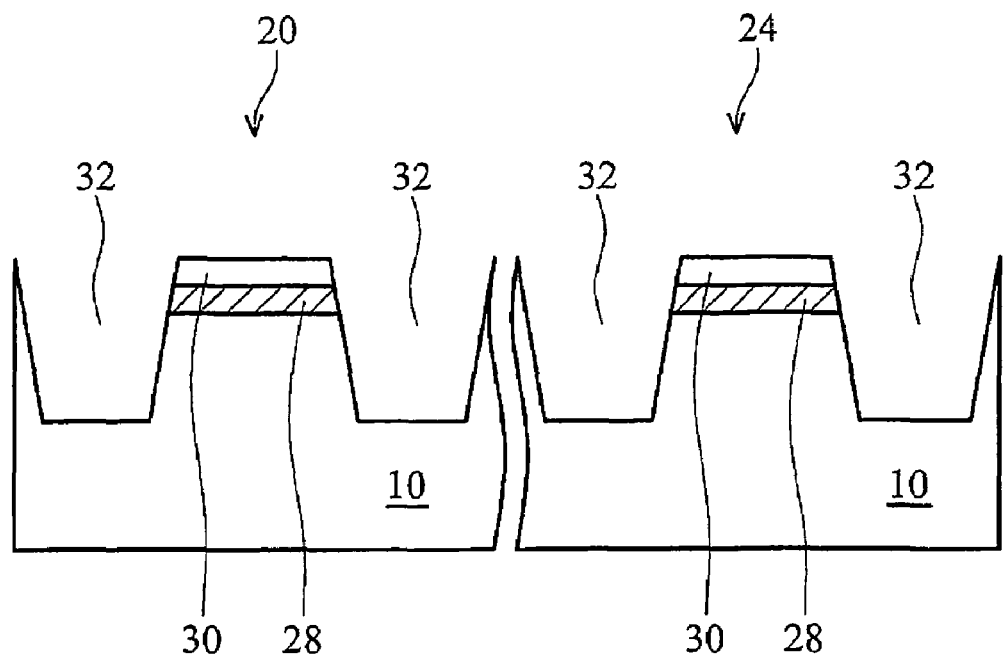
Figure 5:
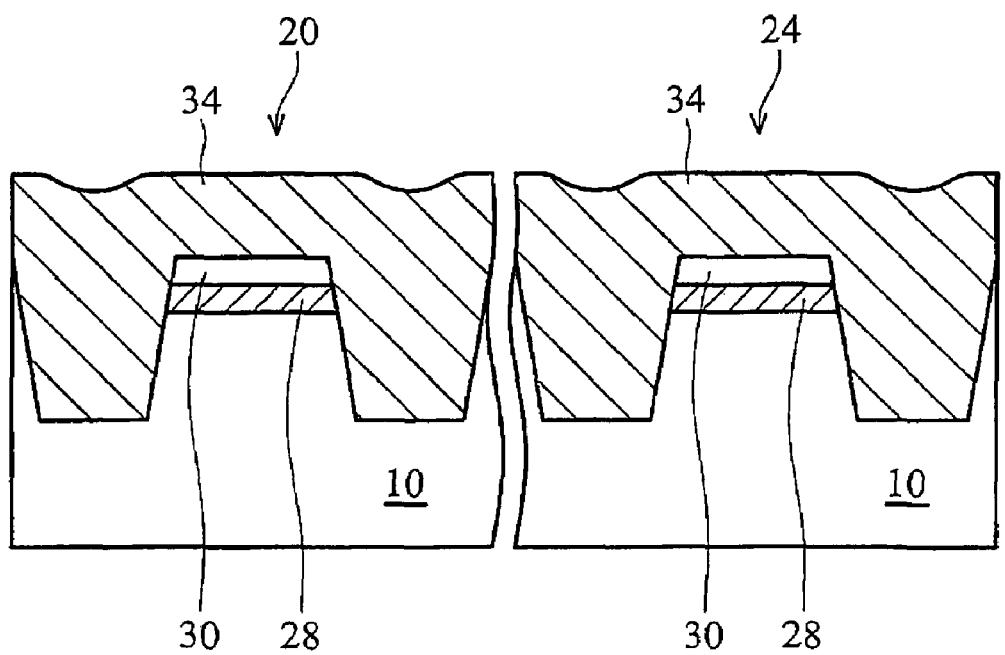
Figure 6:
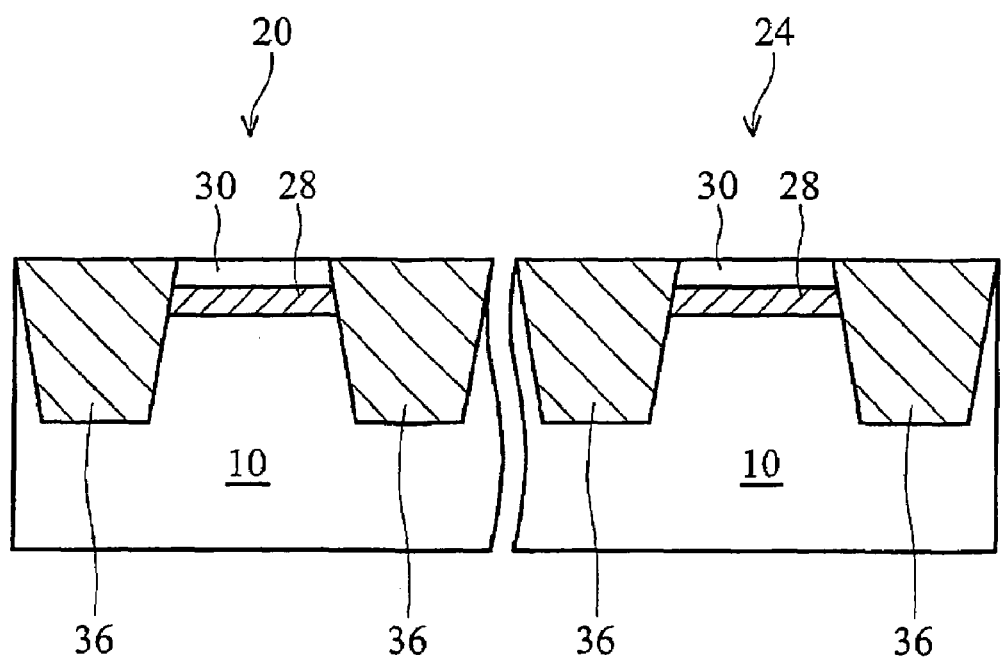

FIGS. 4 through 6 illustrate the formation of isolation structures in isolation regions 22. Trenches 32 are anisotropically formed in the isolation regions 22 by etching through pad layer 28, mask layer 30 and extending into substrate 10. FIG. 4 illustrates the trenches 32 formed in the chip shown in FIG. 3A. In the embodiments shown in FIG. 3B, trenches 32 preferably reach the BOX 12 so that the subsequently formed devices are enclosed in dielectric materials, and thus the leakage current is reduced.

FIG. 5 illustrates the trenches 32 filled with a dielectric material 34. Preferably, the filling material is silicon oxide formed by high-density plasma (HDP). Other materials such as silicon oxynitride may also be used. A chemical mechanical polish (CMP) is then performed to remove excess dielectric material 34, thus a structure as shown in FIG. 6 is formed. The remaining portions of dielectric material 34 form shallow-trench-isolations (STI) 36. Although dielectric material is shown as a single layer, one skilled in the art will recognize that trench 32 may be filled with more than one material, including liner layers, different dielectric layers, and the like.

Figure 7A:
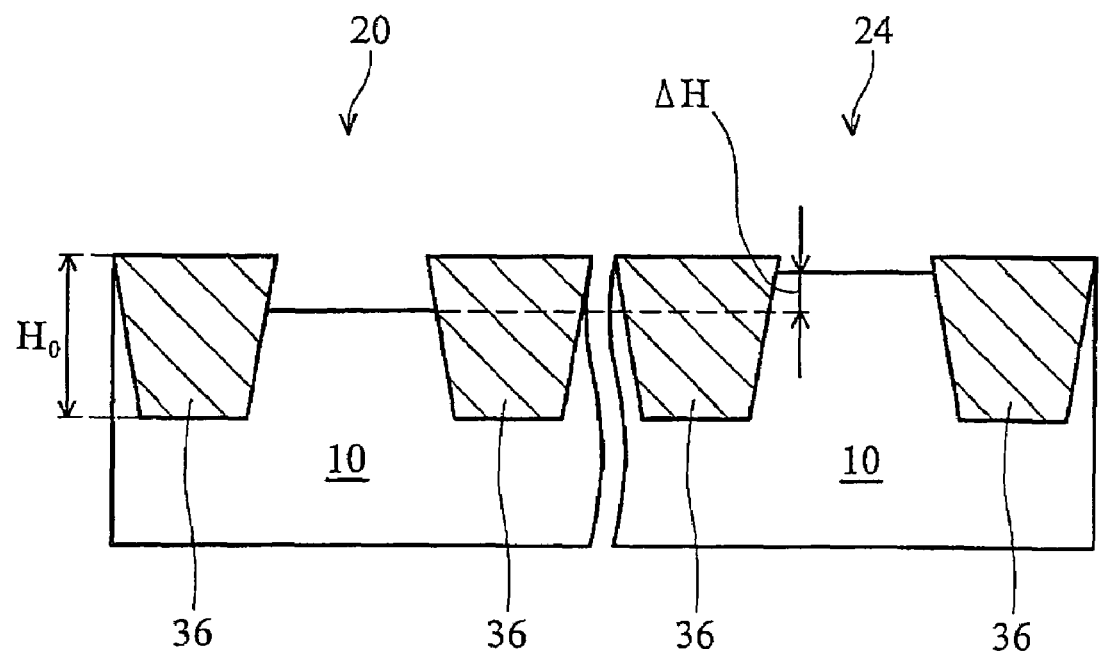
Figure 7B:
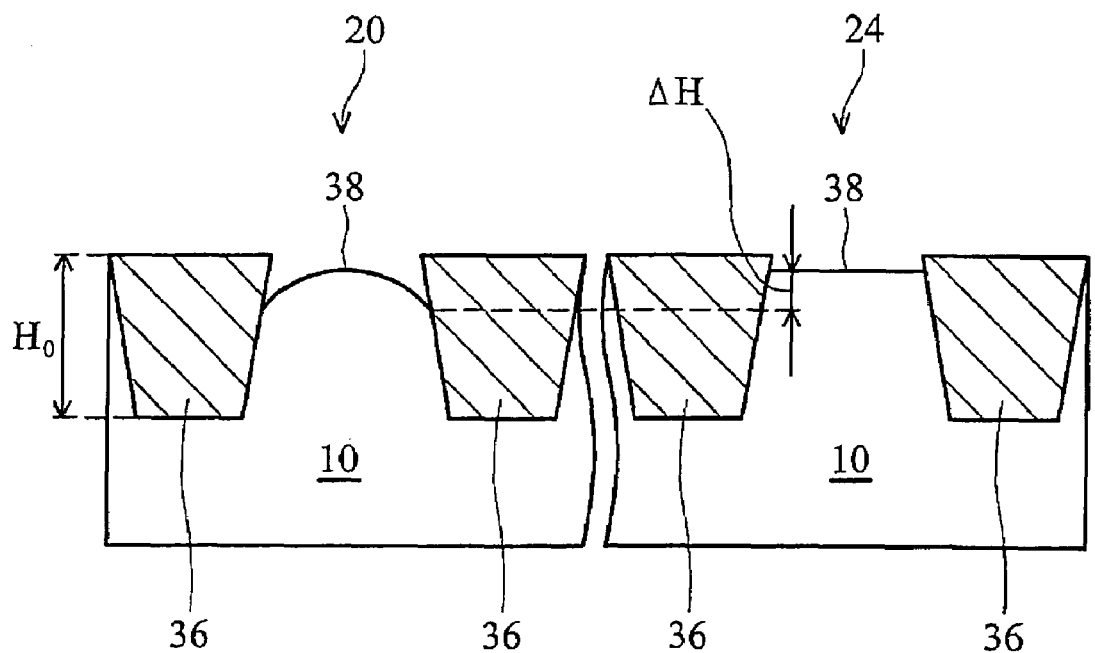

After STI formation, active region 20 is recessed. In the preferred embodiment, a photo resist (not shown) is formed protecting active region 24, and the mask layer 30 and pad layer 28 in the active region 20 are removed. The active region 20 is then recessed. Recessing can be performed by directly dry or wet etching the active region using acids such as $HNO_3$, HF or $CH_3COOH$, and materials in the etcher species such as chloride base gas or fluorine base gas or by oxidizing a surface layer of the active region, and then etching the resulting oxide using acids such as HF acid. The photo resist is then removed, followed by the removal of remaining mask layer 30 and pad layer 28. The resulting structure is shown in FIG. 7A. In the preferred embodiment, the recessing distance $\Delta H$ is preferably greater than about 100 Å, more preferably between about 100 and 1000 Å. In other embodiments, the recessing distance $\Delta H$ is preferably greater than about 20 percent of the height $H_0$ of the STIs 36. FIG. 7A illustrates a schematic view of the active regions 20 and 24 having flat surfaces, while in the practical case, since the etching rate of the substrate close to STIs 36 is typically greater than the etching rate at the center of active region 20, the center of the active region 20 is recessed less, thus forming curved surfaces 38, as shown in FIG. 7B. The curvatures of the surface 38 are preferred features since they help reducing stress caused by the corners of the STIs 36. By using different approaches to recess active region 20, the curvature can be adjusted to desired values.

In alternative embodiments, mask layer 30 and pad layer 28 on the entire chip, including that on regions 20 and 24 are removed first. A selective etching then recesses active region 20, forming the structure shown in FIG. 7A or 7B.

When recessing the active region 20, either wet or dry etching or both can be used. In a preferred embodiment wherein wet etching is performed, in order to achieve minimum loading effect, the etching is preferably performed in a dilute solution at low temperatures, preferably between about 25° C. and about 400° C. In another preferred embodiment wherein dry etching is performed, care has to be taken in adjusting power, dc bias, and pressure, so that plasma damage to the active region is minimized and loading effect is reduced.

An optional surface damage recovery process can be performed to the surface of the active regions 20 and 24. The surface recovery process preferably includes a thermal annealing to restore the lattice structure of the active regions 20 and 24. The surface recovery process may also include an oxidation to oxidize surfaces of the active regions 20 and 24, and a wet etching to remove resulting oxide, thus exposing undamaged semiconductor material.

The active region recessing can be performed to all active regions on a chip, in which case the chip does not include any region 24, or to only a portion of the active regions on the chip. When only a portion of the active regions is recessed, regions 20 and 24 can be of different combinations with different types of devices formed therein. This provides flexibility to circuit design. For example, region 20 may be an SRAM device region and region 24 may be an IO device region. Similarly, region 20 may be a pMOS device region, and region 24 may be an nMOS device region.

Figure 8A:
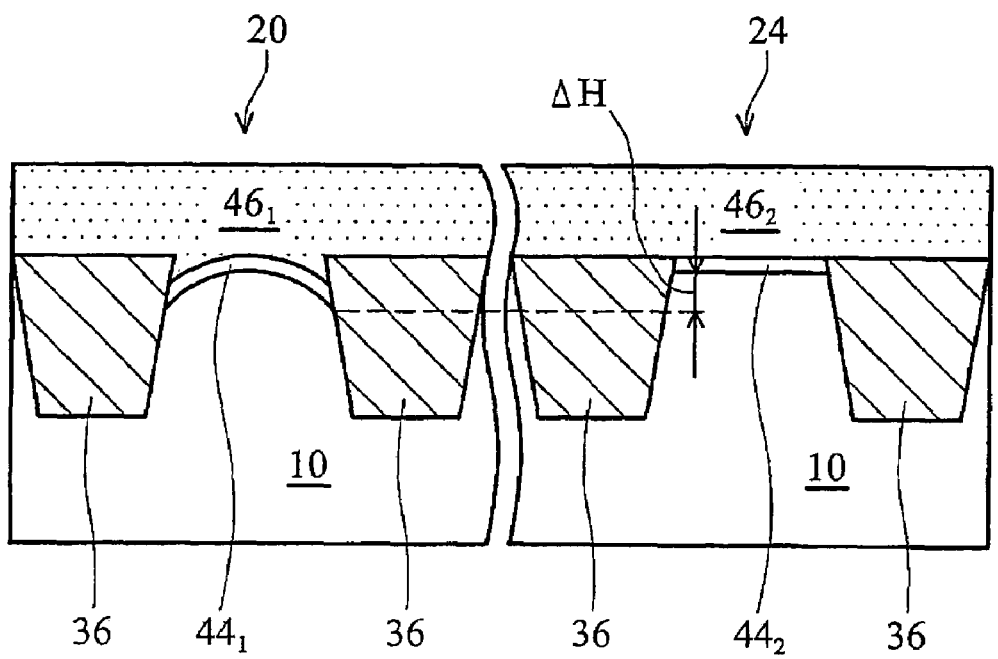

As shown in FIG. 8A, a gate dielectric $44_1$ and a gate electrode $46_1$ are formed on the substrate 10 in active region 20. Similarly, a gate dielectric $44_2$ and a gate electrode $46_2$ are (preferably simultaneously) formed on the substrate 10 in active region 24. As known in the art, to form the gate dielectrics $44_1$, $44_2$ and gate electrodes $46_1$ and $46_2$, a gate dielectric layer may be formed by thermal oxidation or other methods. A gate electrode layer is then formed on the gate dielectric layer. The gate electrode layer is preferably polysilicon, although it may also be a metal or metal compound comprising titanium, tungsten, cobalt, aluminum, nickel or combinations thereof. The gate dielectric layer and gate electrode layer are then patterned to form the respective gate dielectrics $44_1$, $44_2$ and gate electrodes $46_1$ and $46_2$. The semiconductor material under gate dielectrics $44_1$ and $44_2$ eventually becomes the channel regions of the resulting transistors.

Figure 8B:
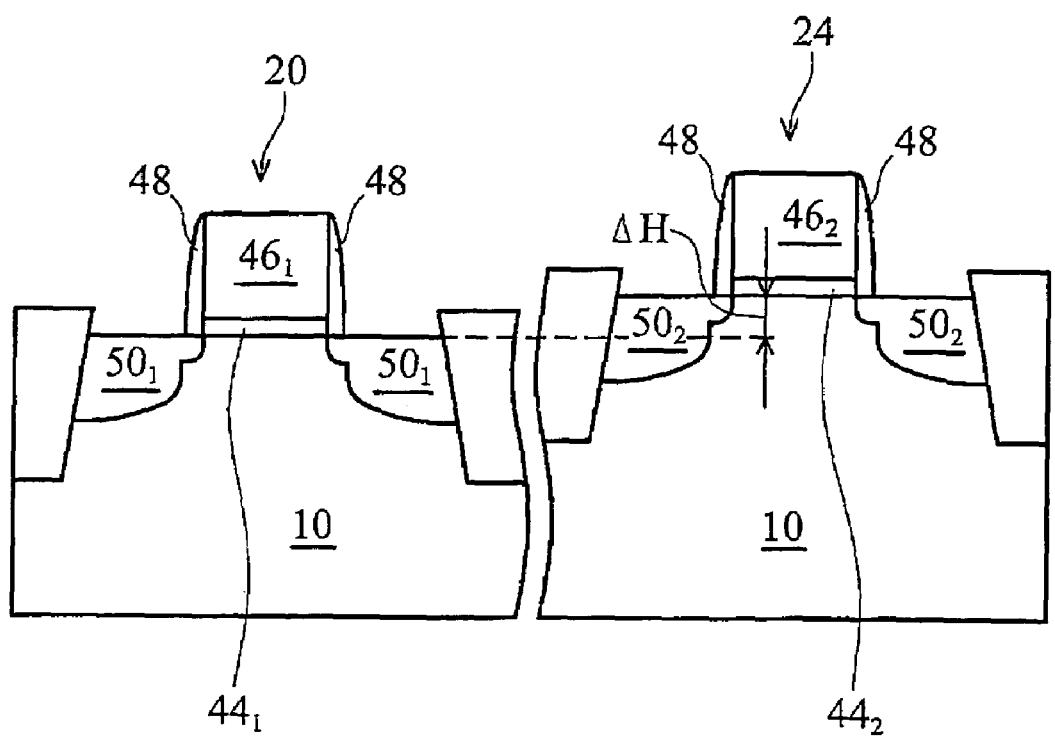

FIG. 8B illustrates a channel length-wise cross-sectional view of the structure shown in FIG. 8A. Spacers are formed along the respective sidewalls of the gate dielectric $44_1$, $44_2$, and gate electrodes $46_1$, $46_2$. Spacers 48 may be formed using well-known methods such as blanket deposition or by selectively depositing a dielectric layer over regions including substrate 10 and gate electrodes $46_1$ and $46_2$, then anisotropically etching to remove the dielectric layer from the horizontal surfaces and leaving spacers 48. Source/drain regions $50_1$ and $50_2$ are then formed. The formation of the source/drain regions $50_1$ and $50_2$ are well known in the art, thus the steps are not repeated herein.

It is known that in a linear operation region, the drive current $I_{DS}$ of a MOS device can be expressed as:

$$I_{DS} = \mu_{eff} C_{ox} (W/L)[(V_{GS} - V_t)V_{DS} - V_{DS}^2/2]. \quad \text{[Eq. 1]}$$

Wherein $\mu_{eff}$ is the effective surface carrier mobility of the carriers in the channel, $C_{ox}$ is gate oxide capacitance, W is channel width, L is channel length, and $V_{GS}$, $V_t$, and $V_{DS}$ are gate-to-source voltage, threshold voltage, and drain-to-source voltage, respectively. Equation 1 reveals that the device current is proportional to the channel width W. Therefore, device drive current $I_D$ can be improved by increasing the channel width W. However, the increase of the channel width is limited. Greater channel width typically requires greater layout area. This requirement conflicts with the increasing demand to form more devices on a chip.

Figure 9:
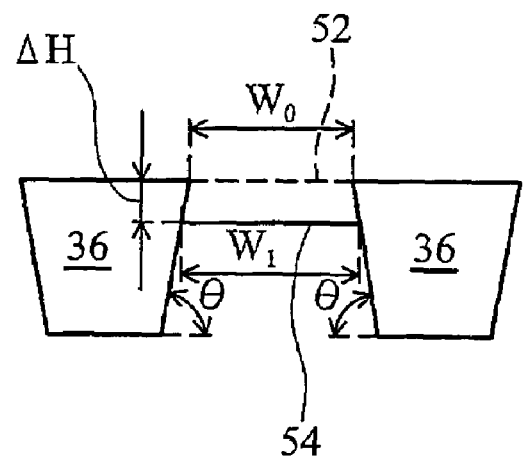
FIG. 9 illustrates the increase of channel width as a result of recessing the active region.

FIG. 9 schematically illustrates effects of recessing an active region. Typically, the sidewalls of STIs 36 have a tilt angle θ that is typically less than 90 degrees. The tilt angle causes lower portions of the active area to have a greater width than the top portion. After recessing the active region, the top surface 52 of the active region is recessed to surface 54. Assuming a MOS device has a drive current of $I_{DS}$ if it is formed on a surface of an un-recessed active region having a width $W_0$, then from Equation 1, it is derived:

$$\Delta I_{DS}/I_{DS} = \Delta W/W_0 = (2 \Delta H \cot \theta)/W_0. \quad \text{[Eq. 2]}$$

Wherein $\Delta I_{DS}$ is the increase of the drive current, and $\Delta W$ equals $(W_1 - W_0)$. Equation 2 reveals that the relative increase of the drive current $\Delta I_{DS}/I_{DS}$ is proportional to the recessing distance $\Delta H$, and the greater the recessing distance $\Delta H$ is, the greater the drive current increment. Also, the drive current increase is related to the tilt angle θ, and the smaller the tilt angle θ is, the greater the drive current increment. Preferably, the tilt angle θ of the isolation structure is less than about 90 degrees, and more preferably less than about 85 degrees, and even more preferably less than about 75 degrees. The drive current increase is also related to the original (un-recessed) channel width $W_0$, and the drive current increase is more significant for MOS devices with smaller width $W_0$. The preferred embodiments of the present invention, therefore, are particular useful when applied to future generations of MOS devices wherein the channel width is increasingly smaller.

In order to lower the tilt angle θ, the tilt angle of the trenches, in which the STIs 36 are formed, has to be reduced. This can be done by adjusting the trench-etching recipe, such as the (etchant) gas ratio, the pressure (including the partial pressure for each etchant gas), and the power. Preferably, higher gas pressure and lower power help to form trenches with a smaller tilt angle θ.

Table 1 shows calculated results based on the previously discussed equations. The tilt angle θ is assumed to be 76 degrees and the recessing distance $\Delta H$ is 50 nm.

TABLE 1

| $W_0$ | 1000 | 500 | 240 | 110 | 80 | 60 | 40 |
|---|---|---|---|---|---|---|---|
| $\Delta I_{DS}/I_{DS}$ | 2% | 5% | 10% | 23% | 31% | 42% | 62% |

It is noted that with a device width of 110 nm and a tilt angle θ of 76 degrees, if the recessing distance is 50 nm, the device width, hence the drive current, can be increased by about 23%. If the device width is 60 nm, with the same recessing distance of 50 nm, the drive current can be increased by 42%.

Figure 10:
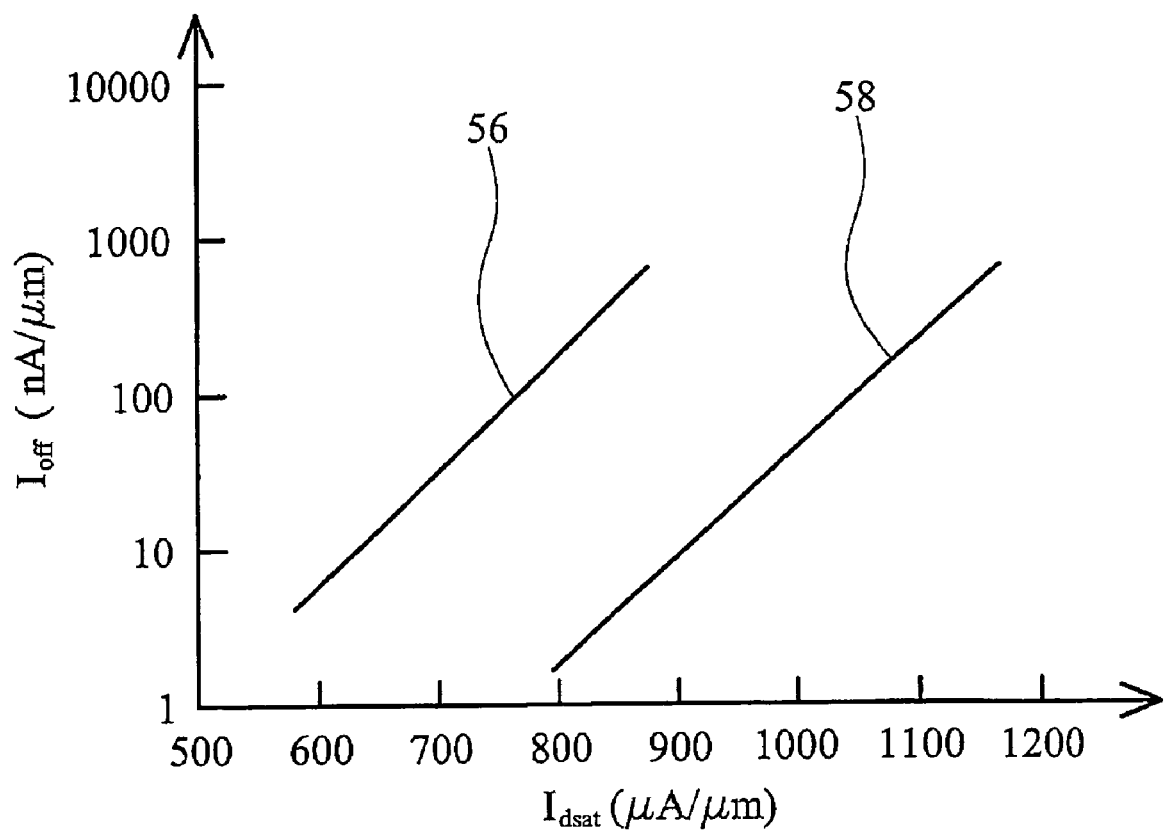
FIG. 10 illustrates results of the preferred embodiments of the present invention, wherein leakage current is shown as a function of drive current.

FIG. 10 illustrates results obtained on sample devices, wherein leakage current is shown as the function of drive current. Line 56 shows results measured from devices formed on un-recessed surfaces of active regions, while line 58 shows results measured from devices formed on recessed surfaces of active regions. Comparing lines 56 and 58, it is observed that recesses of 50 nm result in about 40% drive current enhancement for both NMOS and pMOS at 110 nm device width. At the same time, threshold voltages for both nMOS devices and pMOS devices demonstrate no noticeable adverse effects.

The preferred embodiments of the present invention have several advantageous features. Firstly, by recessing the active region, channel widths of MOS devices are increased without the cost of increasing the layout area. As a result of greater channel width, the drive currents of MOS devices are enhanced. The preferred embodiments are particularly useful for SRAM or logic core devices, and for 110 nm technology and below wherein transistors have narrow widths. Secondly, the preferred embodiments are compatible with existing semiconductor manufacturing processes. The active region recessing can be performed in a selective manner (using an extra mask and patterning step). For example, performed only in the SRAM area, or only in low operating voltage area, etc. This provides flexibility to the circuit design. Thirdly, by recessing the active region, active region surfaces with greater curvature can be formed, thus undesired stress caused by the corners of the STIs is reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   a first and a second isolation region disposed in the substrate and defining a first active region in the semiconductor substrate therebetween, wherein the first and second isolation region have sidewalls with a tilt angle of substantially less than about 90 degrees;
   a gate dielectric in the first active region and over the semiconductor substrate;
   a gate electrode over the gate dielectric;
   a source/drain region substantially aligned with a sidewall of the gate electrode;
   a second active region in the semiconductor substrate, wherein the second active region has a top surface higher than a top surface of the first active region by a height difference of at least about 100 Å;
   an additional gate dielectric in the second active region and over the semiconductor substrate;
   an additional gate electrode over the additional gate dielectric; and
   an additional source/drain region substantially aligned with a sidewall of the additional gate electrode.

2. The semiconductor structure of claim 1, wherein the first active region has a substantially rounded surface.

3. The semiconductor structure of claim 1, wherein the height difference is between about 100 Å and about 1000 Å.

4. The semiconductor structure of claim 1, wherein the height difference is greater than about 20 percent of a depth of the first and second isolation structures.

5. The semiconductor structure of claim 1, wherein the first and second isolation structures are shallow trench isolation regions.

6. The semiconductor structure of claim 1, wherein the tilt angle is less than about 85 degrees.

7. The semiconductor structure of claim 1, wherein the tilt angle is less than about 75 degrees.

8. The semiconductor structure of claim 1, wherein the first active region is a core device region and the second active region is a peripheral device region.

9. The semiconductor structure of claim 2, wherein the substantially rounded surface comprises a central portion, and edge portions surrounding the central portion, and wherein the central portion is higher than the edge portions.

10. The semiconductor structure of claim 9, wherein the top surface of the second active region is substantially planar.

11. A semiconductor structure comprising:
    a semiconductor substrate;
    a first and a second isolation structure in the semiconductor substrate and having a first active region therebetween, wherein the first and the second isolation structures have sidewalls with a tilt angle of less than about 85 degrees;
    a third and a fourth isolation structure in the semiconductor substrate and having a second active region therebetween, wherein the second active region is higher than the first active region for a height difference greater than about 100 Å;
    a first gate dielectric in the first active region and over the semiconductor substrate;
    a first gate electrode over the first gate dielectric; and
    a first source/drain region substantially aligned with a sidewall of the first gate electrode.

12. The semiconductor structure of claim 11, wherein the height difference is between about 100 Å and about 1000 Å.

13. The semiconductor structure of claim 11, wherein the height difference is greater than about 20 percent of a depth of the first and second isolation structures.

14. The semiconductor structure of claim 11 further comprising:
    a second gate dielectric in the second active region and over the semiconductor substrate;
    a second gate electrode over the second gate dielectric; and
    a second source/drain region substantially aligned with a sidewall of the second gate electrode.

15. The semiconductor structure of claim 11, wherein the first and second isolation structures are shallow trench isolations.

16. The semiconductor structure of claim 11, wherein the first active region is a core device region and the second active region is an I/O device region.

17. The semiconductor structure of claim 11, wherein a top surface of the first active region comprises a central portion, and edge portions surrounding the central portion, and wherein the central portion is higher than the edge portions.

18. The semiconductor structure of claim 17, wherein a top surface of the second active region is substantially planar.

* * * * *